MULTIPLE SEMICONDUCTOR ASSEMBLY

Filed April 22, 1959

INVENTOR

Kurt Lehovec

BY Connolly and Hutz

ATTORNEYS

United States Patent Office 3,029,366

Patented Apr. 10, 1962

3,029,366

MULTIPLE SEMICONDUCTOR ASSEMBLY

Kurt Lehovec, Williamstown, Mass., assignor to Sprague Electric Company, North Adams, Mass., a corporation of Massachusetts Filed Apr. 22, 1959, Ser. No. 808,249
7 Claims. (Cl. 317—101)

This invention relates to a multiple semiconductor assembly, and more particularly to a plurality of semiconductive devices produced on a single semiconductor slice. Still more particularly, this invention relates to the micro-miniaturization of semiconductor assemblies by the preparation of several transistors and related devices on a single semiconductor slice, and the utilization of the resistive and capacitive properties of regions in that slice.

The present day miniaturization of electronic components has reached a state of art that may now be termed "micro-miniaturization," which may be defined as the assembly of a plurality of complementary components in an extremely small volume. Considerable activity has been expended in micro-miniaturizing circuits in which a plurality of transistors is employed. This micro-miniaturization activity has included the concept of direct coupling between stages of some particular types of transistors; e.g., surface-barrier and alloy-junction transistors have properties that permit their use in so-called common-emitter configurations in which the voltage at the collector of one transistor may be high enough to cause saturation at the base of the next transistor in the circuit. An article entitled, "Directly Coupled Transistor Circuits" by R. H. Beter, W. E. Bradley, R. B. Brown and M. Rubinoff, which was published in Electronics for June 1955, discloses the concept of employing a common-emitter transistor amplifier having more than one base connected to a single collector. Others in the art have suggested processes for producing a plurality of p-n junctions in a single semiconductor body; e.g., G. K. Teal U.S. Patent 2,727,840 and R. N. Hall U.S. Patent 2,822,308. However, great difficulty has been experienced in reaching the objective of a generally acceptable multi-transistor assembly on a single semiconductor body, because transistors so-produced have been electrically connected through the semiconductor slice. For example, in transistors of the alloy-junction type wherein the semiconductor slice of homogeneous impurity concentration represents the base of the transistor, all transistors in a multi-transistor assembly are connected to a common base, which is not a desirable configuration for many circuit applications.

A further example of the restricted nature of prior art multi-transistor assemblies is found in my U. S. Patent 2,779,877 issued January 29, 1957, which discloses and claims a signal translating device comprising a semiconductive crystal of the symmetrical grown junction type having two fused junctions disposed inwardly from opposed surfaces of the crystal.

It is an object of this invention to overcome these and other deficiencies of the prior art.

It is a further object of this invention to produce an assembly having a plurality of semiconductive components on a single semiconductor slice, and to provide a sufficient degree of electrical insulation between these semiconductive components through the semiconductor slice so as to permit a circuit designer to have substantial freedom in the interconnection of the components.

It is a still further object of this invention to produce an assembly having a plurality of transistors together with other components such as capacitors, resistors and diodes on a single semiconductor slice.

These and other objects of this invention will become more apparent upon consideration of the following detailed description when read in conjunction with the accompanying drawing, wherein:

FIGURE 1 is a diagrammatic perspective view of a multiple semiconductor assembly constructed in accordance with this invention, with electrical circuit wiring attached thereto to accomplish the circuit shown in FIGURE 3;

FIGURE 2 is a diagrammatic cross-section of the multiple semiconductor assembly taken along line 2—2 in FIGURE 1; in order to establish a clearer picture of the electrical interconnection of the various semiconductive components, FIGURE 2 is not a true cross-section of FIGURE 1, in that the contacts at the front surface of the assembly of FIGURE 1 have been shown again on the diagrammatic cross-section of FIGURE 2, although it should be understood that these contacts are not in the plane 2—2 of FIGURE 1;

In general, the objects of this invention are attained by a multiple semiconductor assembly in which a plurality of semiconductor components are prepared on the same semiconductor slice in such a manner as to ensure electrical separation of the terminals of the individual semiconducting components. Since these semiconducting components will be transistors in many cases, the following description will be directed specifically to transistors although the concept of the invention applies also to other components, such as capacitors, resistors and diodes.

More particularly the objects of this invention are attained by utilizing a semiconductor slice having a series of p-n junctions that are so constructed and arranged that a transistor may be produced on each of a plurality of regions that are separated from one another by at least one additional p-n junction.

It is well known that a p-n junction has a high impedance to electric current, particularly if biased in the so-called "blocking direction," or with no bias applied. Therefore, any desired degree of electric insulation between two components assembled on the same slice can be achieved by having a sufficiently large number of p-n junctions in series between the two semiconducting regions on which said components are assembled. For most circuits, one to three p-n junctions will be sufficient to achieve the desired degree of insulation. These p-n junctions may be placed quite closely to each other. However, it is often required that they are placed sufficiently far apart from each other that the multiple p-n junction structure used for electric insulation should not act as an active semiconducting element such as a transistor or a four-layer npnp diode. In order to assure this condition, it is required that the region between two junctions is wider than a small multiple of the diffusion length of the minority carriers in said region. The diffusion length is the square root of the diffusion constant multiplied by the lifetime of these minority carriers. For instance, assuming a diffusion constant of 40 cm.$^2$ per second and a lifetime of 1 microsecond, a diffusion length of $60 \times 10^{-4}$ cm. or approximately 2 mils results, and a separation of 4 mils between the two junctions will be sufficient to avoid any appreciable interaction by carrier injection between the two junctions delineating said region.

In a restricted form of this invention, the objects are attained by a multiple transistor assembly comprising a semiconductor slice that is provided with a plurality of transistors that are separated by a plurality of regions of alernating p and n type conductivity, with one of said plurality of regions serving as a resistor element in said transistor in a circuit assembly.

Figure 1:
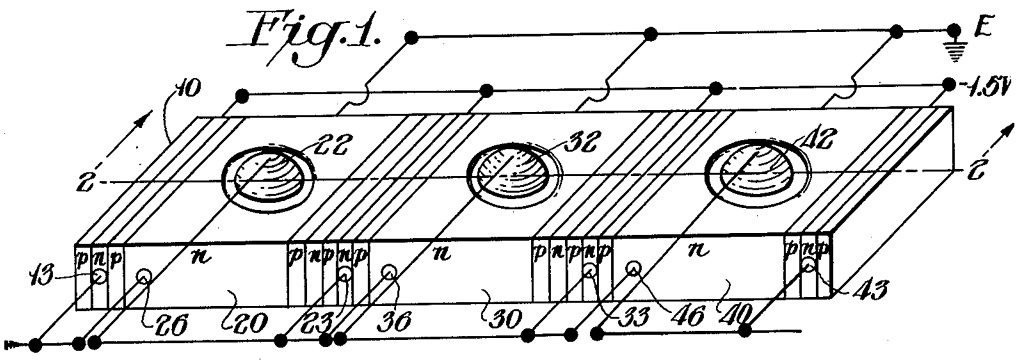
Figure 2:
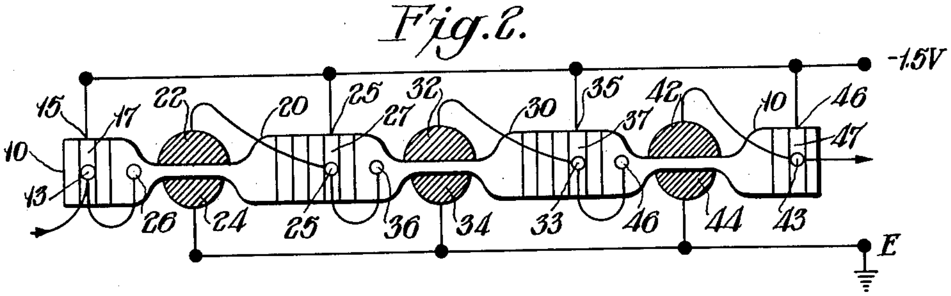

FIGURES 1 and 2 of the drawing show a semiconductor slice 10 having recurring series of p-n junctions throughout its length. A plurality of narrow regions of alternating conductivity types are shown as being separated by relatively wide regions 20, 30, and 40. That is, there are three regions of greater width than the rest of the regions, and between any two of these wider regions there are a plurality of the regions of narrow width. Each of the n-type regions 20, 30 and 40 is separated from the other two wide regions by a plurality of the narrow width regions of alternating conductivity types, which are exemplified by n-type regions 17, 27, 37 and 47. The narrow width regions shown in the drawing are of substantially equal width. However, it is desirable in providing devices for some circuit configurations to utilize regions of varying widths. Therefore, it should be understood that the term "narrow regions" as employed in this specification includes regions of both equal and unequal widths.

Semiconductor slice 10 is preferably obtained by cutting a slice from a crystal that has been produced according to the presently well-known "rate-growing" process. A detailed description of the process and apparatus employed in rate-growing semiconductor crystals is found in the above noted U.S. Patent 2,822,308 to R. N. Hall, and is succinctly described in a paper by Hall entitled "P-N Junctions Produced by Growth Rate Variation" that appeared in Physical Review 88, 139 (1952). For the purposes of describing this invention, rate-growing may be summarized by noting that the impurity concentration in a germanium crystal pulled from a melt containing antimony is related to the impurity concentration in the melt by the so-called segregation factor $k$. It is recognized in the art that this segregation factor is a function of the growth rate of the crystal from the melt in the case of some impurities (e.g., antimony) but not in the case of most other impurities, including indium and gallium. From these facts, it has been found that an ingot grown from a germanium melt doped with the proper amount of antimony and indium (or gallium) will be p-type (excess of indium) when grown slowly, and n-type (excess of antimony) when grown rapidly. The substantially uniform width alternating p and n regions shown in FIGURES 1 and 2 between the wider n-type regions 20, 30 and 40 are produced by cycling the growth rate of the ingot, whereas wider regions 20, 30 and 40 are produced by timing the growth rate in the manner taught in the Hall patent.

To obtain results of the highest order of predictability and reproducibility, semiconductor slice 10 is cut from the crystal so as to be oriented in the direction of crystal growth in the ingot. This oriented cutting produces a slice that exhibits alternate regions of p-type and n-type resistivities that uniformly extend across the complete width of the slice.

The wide n-type regions 20, 30, and 40 are converted into transistors by the utilization of conventional processes such as the alloy-junction transistor technique or the electrochemical transistor technique. Alloy-junction transistor techniques are described in the chapter entitled, "Uniform Planar Alloy Junctions for Germanium Transistors" by C. W. Mueller and N. H. Ditrick in Transistors I, pp. 121–131, RCA Labs (1956). Electrochemical transistor techniques are described in a series of five papers by members of the technical staff of the Philco Research Division that were published in Proceedings of the I.R.E. 41, (12) 1702–1720 (1953).

As shown more clearly in FIGURE 2, collectors 22, 32 and 42 are fabricated respectively on one face of slice 10 within regions 20, 30 and 40. On the opposite face of slice 10, emitter electrodes 24, 34 and 44 are fabricated so as to produce the typical narrow web between collector and emitter that characterizes the electrochemical and alloy-junction transistors. While the method and materials utilized in producing these junctions are not an essential part of this invention, it should be noted that for the n-type germanium regions 20, 30 and 40 shown in FIGURES 1 and 2, than an indium-gallium alloy of 98% indium and 2% gallium provides a preferred rectifying emitter junction, and a pure indium alloy provides a preferred collector junction. Ohmic base contacts 26, 36 and 46 are produced to complete the transistors in each of the regions 20, 30 and 40. These ohmic contacts are preferably produced by utilizing an alloy of 97% tin and 3% arsenic.

Figures 3, 4:
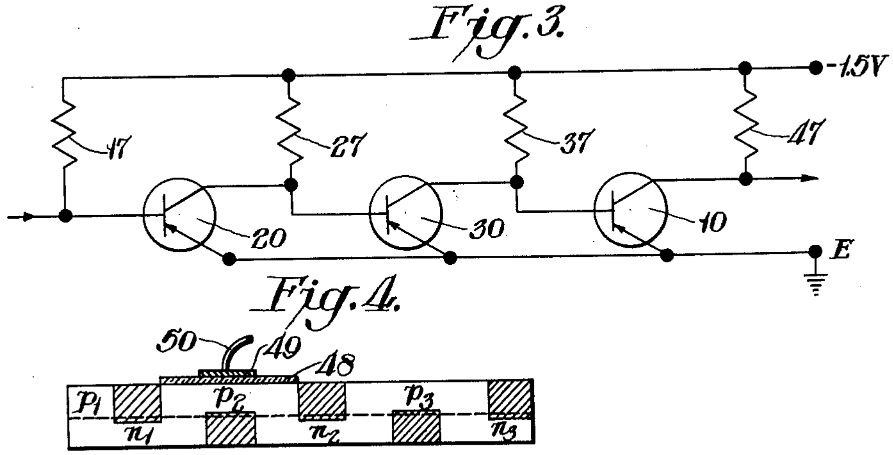
FIGURE 3 is a schematic diagram of a chain of direct coupled amplifiers which may be assembled on a single semiconductor slice of the configuration shown in FIGURE 1 in accordance with this invention.
FIGURE 4 is a diagrammatic cross-sectional view through a multiple region semiconducting slice such as may be used in the construction of another embodiment of the multiple semiconductor assemblies according to this invention.

The schematic diagram shown in FIGURE 3 of the drawing is the circuit shown in FIGURE 2(A) in the above identified Beter et al. publication in Electronics. This circuit is a chain of direct coupled amplifiers that employs a resistor between each transistorized stage. These resistors are fabricated on semiconductor slice 10 by making ohmic contact to the opposed edges of one of the n-type regions that separates the wide n-regions from one another. These resistor contacts shown in FIGURES 1 and 2 are ohmic contacts produced by the tin-arsenic alloy mentioned above. The area of the alloy contacts for these resistors, for example contacts 13 and 15 to n-region 17, may overlap onto the adjacent p-type regions without affecting the resistance value, since the tin-arsenic alloy employed has a high impedance to p-type zones, forming a rectifying junction thereto. While the method of producing resistors on semiconductor slice 10 has been described in terms of contacts 13 and 15 to region 17, it should be understood that regions 27, 37 and 47 are provided similarly with pairs of contacts 23, 25 and 33, 35 and 43, 45, respectively.

When capacitors of low capacitance are required in a circuit, it is necessary only that ohmic contacts be made to the face of adjacent regions across a p-n junction, or alternatively that an ohmic and a rectifying contact be made to opposite edges of a single region. The capacities that can be best provided by this use of narrow regions on the semiconductor slice are in the 1 to 100 micromicrofarad range. When circuit configurations require capacities that are outside the limits set by the geometrical dimensions and resistivities of the p and n regions of the semiconductor slice, the lead-wires used to interconnect the various regions of the slice are employed to connect "lumped" or discrete external components in the circuit. Alternatively, the external components can be provided on portions of the semiconductor slice by utilizing an insulating film coating as a substrate on the desired portions, and then depositing the components by known techniques; e.g., printing or vaporizing in the case of resistors, and multi-layer build-ups of alternating layers of metal and ceramic in the case of capacitors. Simple and effective processes for producing the insulating substrate include high temperature air-oxidation, and anodization, e.g., a quartz layer in the case of silicon. This quartz layer may also serve as a dielectric of a capacitor whose electrodes are the underlying semiconducting region and a metal film deposited on the quartz layer.

The electrical connections may be made to the various alloy contacts on semiconductor slice 10 by a number of generally conventional techniques. It should be understood that the electrical connections to the various alloy contacts on semiconductor slice 10 need not be made in accordance with the illustrative connections shown in FIGURES 1 and 2. For instance, wire contacts may be attached to the emitter or collector electrodes and thereafter circuit wires may be secured to the wire contacts to make connection to the emitter, collector or base regions of another transistor. An alternate system of electrical contacts utilizes hemispherical metal alloy base contacts for each transistor and then connects emitters, collectors and base contacts of various transistors by means of a printed circuit board that is placed in contact with the hemispherical contacts. Still another system of electrical connections utilizes the "deposited" or printed circuit techniques described above, which includes coating the semiconductor slice with an inert insulating material such as evaporated quartz, then removing the quartz layer from the actual contact areas, and then by use of suitable conductive inks the connection desired between the emitter, collector and base contacts may be printed on the quartz.

The extreme micro-miniaturization afforded by this invention is apparent from consideration of the fact that the construction shown in FIGURES 1 and 2 of the drawing was produced on a germanium semiconductor slice having a thickness of 4 mils, a width of 20 mils, and a length of 90 mils. The narrow width regions are of from 1 to 5 mils, with substantially uniform regions of 2 mils as the preferred construction; the large n-type regions on which the transistors are fabricated are preferably of 20 mils width. The resistivity of the n-type regions to which the electrical contacts are made is approximately 1 ohm centimeter.

Figure 5:
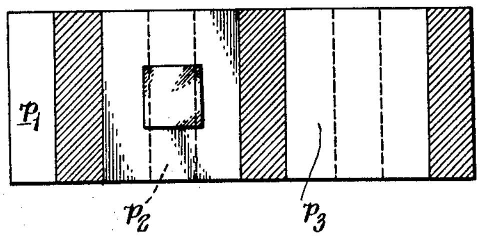
FIGURE 5 is a diagrammatic plan view of the multiple region semiconductor slice of FIGURE 4.

Another method for making multiple p and n junctions on the same slice of semiconducting material is illustrated for the case of silicon. A silicon crystal is pulled containing arsenic as an impurity to give the crystal n-type conductivity. A slice is cut from this crystal and is subjected to surface melting, i.e. the slice is positioned under a heat source which melts the surface layer of the slice. A detailed description of surface melting is given by K. Lehovec and E. Belmont in an article entitled "Preparation of p-n Junctions by Surface Melting" in Journal of Applied Physics 24 (12), 1482–1484 (1953). Aluminum is introduced into the melted portion at a sufficient concentration such that upon recrystallization, the melted portion exhibits p-type conductivity. This provides a slice with a p-n junction through its middle as indicated in FIGURE 4. By cutting and lapping techniques, a slice with parallel surfaces is produced with a total thickness of approximately 6 mils, the junction being through the center of the slice and parallel to its large surfaces. FIGURE 4 indicates a blown-up drawing of the cross section of the slice and indicates means by which this slice can be transformed in a series of p and n regions. In FIGURES 4 and 5 the series of p and n regions are numbered in subscripts. The transforming means consists of machining grooves into the slice, whereby these grooves protrude alternately from the p-type side and the n-type side and cut through the p-n junction. The material removed by the grooves is indicated by the dashed regions in FIGURE 4. FIGURE 5 gives a top view of the slice indicating the grooves which protrude from the p-type surface. It is clear that in order to proceed from the region $P_1$ to the region $P_2$ through the slice, one has to cross two p-n junctions, while in order to proceed from the region $P_1$ to $P_3$, one has to cross four p-n junctions. Thus, one may separate two p regions by any desired number of junctions depending on the closeness of the grooves. Two additional layers atop region $P_2$ illustrate an insulating substrate covering a portion of the slice and an electrical component on the substrate in circuit with the semiconductor device. A substrate 48 is provided on the region $P_2$ by suitable means and an electrical component 49 is positioned on the substrate 48 by suitable means such as metallization. A lead 50 is connected to the electrical component 49.

In the preparation of the grooves there are several well-known techniques which may be employed, e.g., the grooves may be produced by ultrasonic cutting, or by masking techniques with photoresists and chemical etching, or by electrochemical jet etching. Multiple p-n regions on the same slice as illustrated in FIGURES 4 and 5 can be used in the same manner as the multiple p-n junctions in the rate-grown slice illustrated in FIGURES 1 and 2.

Other circuit constructions and configurations are attained on a single semiconductor slice in accordance with this invention by shorting out one or more of the p-n junctions by depositing metal films completely across the junctions. Others of the p-n junctions fabricated in a single semiconductor slice in accordance with this invention may be utilized as circuit elements such as capacitors or diodes. Furthermore, other regions in the semiconductor slice may be used for discrete resistance purposes either as a substrate for printed resistors or as the resistor material proper; e.g., by providing non-rectifying alloy contacts at the two ends of a narrow region of homogeneous conductivity separated by p-n junctions from the rest of the semiconductor slice.

Although the two specific examples of this invention have been described in terms of germanium and silicon, respectively, it should be understood that this invention is capable of utilizing other semiconductive materials; e.g., silicon carbide, and intermetallic compounds of group III–V elements.

It should be understood that although the invention has been described in terms of the construction wherein the transistors are fabricated on n-type regions, it is within the concept of the invention to utilize p-type regions. Similarly the resistors, capacitors and diodes constructed or fabricated on the narrow regions may employ either p or n type conductivity regions.

It will be understood that the above identified embodiments of this invention are for purpose of illustration only, and that modifications may be made without departure from the spirit of the invention. It is intended that this invention be limited only by the scope of the appended claims.

What is claimed is:

1. A multiple semiconductor assembly comprising a semiconductor slice having a plurality of regions of alternating p and n conductivity types to thereby provide a plurality of p-n junctions, at least two semiconducting components assembled each on one of said regions of said slice, said components being separated by a plurality of said regions so as to provide therebetween at least two p-n junctions thereby achieving electric insulation of said components through said slice by the impedance of said p-n junctions.

2. A multiple semiconductor assembly comprising a semiconductor slice having a plurality of regions of alternating p and n conductivity types to thereby provide a plurality of p-n junctions, two of said regions being separated by at least two of said p-n junctions, and semiconductor devices fabricated on said separated regions, whereby said semiconductor devices are electrically isolated from one another by said at least two p-n junctions.

3. A multiple semiconductor assembly as defined in claim 2 wherein at least one of said semiconductor devices is a transistor.

4. A multiple semiconductor assembly as defined in claim 3 wherein said transistor has emitter and collector contacts on opposite faces of said slice.

5. A multiple semiconductor assembly as defined in claim 2 wherein electrical circuit contacts are made on opposite sides of one of said separating p-n junctions to thereby provide a semiconductive component in circuit with said semiconductor devices.

6. A multiple semiconductor assembly as defined in claim 2 wherein spaced electrical circuit contacts are made to one of said plurality of regions to thereby provide a semiconductive component in circuit with said semiconductor devices.

7. A multiple semiconductor assembly as defined in claim 2 wherein portions of said slice are covered by an insulating substrate, and electrical components are provided on said substrate in circuit with said semiconductor devices.

(References on following page)

References Cited in the file of this patent

UNITED STATES PATENTS

| | | |
|---|---|---|
| 2,586,080 | Pfann | Feb. 19, 1952 |
| 2,588,254 | Lark-Horovitz | Mar. 4, 1952 |
| 2,663,806 | Darlington | Dec. 22, 1953 |
| 2,663,830 | Oliver | Dec. 22, 1953 |
| 2,833,969 | Christian | May 6, 1958 |
| 2,838,617 | Tummers et al. | June 10, 1958 |
| 2,874,232 | Jochems | Feb. 17, 1959 |
| 2,898,454 | Loughlin | Aug. 4, 1959 |
| 2,944,165 | Stuetzer | July 5, 1960 |

OTHER REFERENCES

The Dofl Microelectronics Program, by Prugh, Nall and Doctor; published May 1959 in the Proceedings of the I.R.E., page 886 (pages 882–893 are cited to further show the start of the art).

The Micro-Module: A Logical Approach to Microminiaturization by Dauko, Doxey and McNaul; published May 1959 in the Proceedings of the I.R.E.; page 902 (pages 894–902 are cited to further show the state of the art).